US007280091B2

(12) United States Patent
Wang et al.

(10) Patent No.: US 7,280,091 B2
(45) Date of Patent: Oct. 9, 2007

(54) ANALOG FRONT-END CIRCUIT FOR DIGITAL DISPLAYING APPARATUS AND CONTROL METHOD THEREOF

(75) Inventors: Chi-Feng Wang, Taipei Hsien (TW); Jui-Yuan Tsai, Tai-Nan (TW); Yu-Pin Chou, Miao-Li Hsien (TW); Jin-Sheng Gong, Tao-Yuan Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/279,251

(22) Filed: Apr. 11, 2006

(65) Prior Publication Data

US 2006/0164551 A1 Jul. 27, 2006

Related U.S. Application Data

(63) Continuation-in-part of application No. 10/771,031, filed on Feb. 3, 2004.

(30) Foreign Application Priority Data

Apr. 17, 2003 (TW) .............................. 92108991 A
Apr. 11, 2005 (TW) .............................. 94111364 A

(51) Int. Cl.
*G09G 3/36* (2006.01)
*H03M 1/06* (2006.01)

(52) U.S. Cl. ......................................... 345/96; 341/118

(58) Field of Classification Search .................. 345/96, 345/97, 98, 99, 100; 348/537, 572; 341/118, 341/155, 161
See application file for complete search history.

(56) References Cited

U.S. PATENT DOCUMENTS

| | | | | |
|---|---|---|---|---|
| 6,014,258 | A | 1/2000 | Naka et al. | |
| 6,414,611 | B1 * | 7/2002 | Nagaraj | 341/118 |
| 6,545,626 | B1 * | 4/2003 | Nakada | 341/155 |
| 2003/0034984 | A1 | 2/2003 | Murata | |

FOREIGN PATENT DOCUMENTS

| | | |
|---|---|---|
| TW | 475333 | 2/2002 |

* cited by examiner

*Primary Examiner*—Richard Hjerpe
*Assistant Examiner*—Jean Lesperance
(74) *Attorney, Agent, or Firm*—Winston Hsu

(57) ABSTRACT

An analog front-end (AFE) circuit of a digital display is disclosed including: a first circuit to intermittently invert a working clock to generate a control signal and to generate a sampling signal, wherein the sampling signal is corresponding to the working clock; a first analog-to-digital converter (ADC) coupled to the first circuit for converting an analog video signal into a first digital video signal according to the sampling signal; a second analog-to-digital converter coupled to the first circuit for converting the analog video signal into a second digital video signal according to the sampling signal; and a first multiplexer for selectively outputting the first digital video signal or the second digital video signal according to the control signal.

20 Claims, 5 Drawing Sheets

ANALOG FRONT-END CIRCUIT FOR DIGITAL DISPLAYING APPARATUS AND CONTROL METHOD THEREOF

CROSS REFERENCE TO RELATED APPLICATIONS

This is a continuation-in-part of U.S. application Ser. No. 10/771,031, filed Feb. 3, 2004, entitled "IMAGE SIGNAL PROCESSING METHOD AND DEVICE," which is cooperated by reference herein.

BACKGROUND OF THE INVENTION

1. Field of the Invention

The present invention relates to analog front-end (AFE) circuits, and more particularly, to analog front-end circuits for digital displaying apparatus and control methods thereof.

2. Description of the Prior Art

In various digital displaying apparatuses, such as the liquid crystal display (LCD) and the plasma display panel (PDP), an analog front-end (AFE) circuit is typically employed to convert the analog RGB signals into digital signals.

Please refer to FIG. 1, which shows a block diagram of a conventional analog front-end (AFE) circuit 100 of a digital display. As shown, the AFE 100 comprises a clock generator 110, a bandgap voltage reference 120, and three color processing modules 130, 140, and 150 for processing the three analog signals R, G, and B, respectively. Each color-processing module comprises a clamp circuit, a gain and offset adjusting circuit, and an analog-to-digital converter (ADC). The operations of the above components are well known in the art and further details are therefore omitted for brevity.

The performance of the analog-to-digital converters of the AFE 100 influences the image quality of the digital display. For example, in a 15-inch LCD monitor, the ADC must operate at 94.5 MHz when the displaying mode is configured to 1024*768*85 Hz (i.e., the XGA mode). In a 17-inch LCD monitor, the ADC must operate at 157.5 MHz when the displaying mode is configured to 1280*1024*85 Hz (i.e., the SXGA mode). Thus, it can be seen that the ADC must operate at higher speeds for higher resolution displaying modes.

In the conventional art, a time-interleaved ADC architecture is typically employed in the AFE circuit. FIG. 2 illustrates a simplified block diagram of an AFE circuit 200 adopting the interleaved ADC architecture according to the prior art. In the AFE circuit 200, however, the mismatch between analog-to-digital converters 220 and 230 easily results in problems such as: offset error, gain error, and phase difference. In some displaying modes or pictures, these problems become more obvious and may be detectable by human eyes. For example, an offset between the ADCs 220 and 230 may cause the presence of stripes or saw tooth artifacts in the screen image thereby negatively affecting the image quality of the digital display.

SUMMARY OF THE INVENTION

It is therefore an objective of the claimed invention to provide analog front-end circuits of a digital display to solve the above-mentioned problems.

According to an exemplary embodiment of the claimed invention, analog front-end (AFE) circuits of a digital display and related controlling methods are disclosed. One proposed AFE circuit comprises: a first circuit to intermittently invert a working clock to generate a control signal and to generate a sampling signal, wherein the sampling signal is corresponding to the working clock; a first analog-to-digital converter (ADC) coupled to the first circuit for converting an analog video signal into a first digital video signal according to the sampling signal; a second analog-to-digital converter coupled to the first circuit for converting the analog video signal into a second digital video signal according to the sampling signal; and a first multiplexer for selectively outputting the first digital video signal or the second digital video signal according to the control signal.

These and other objectives of the present invention will no doubt become obvious to those of ordinary skill in the art after reading the following detailed description of the preferred embodiment that is illustrated in the various figures and drawings.

DETAILED DESCRIPTION

The operations for processing each of the RGB signals are substantially the same as one other. For convenience and simplification of the descriptions, the operations of processing only a single RGB signals is utilized as an example hereinafter.

Figure 1:
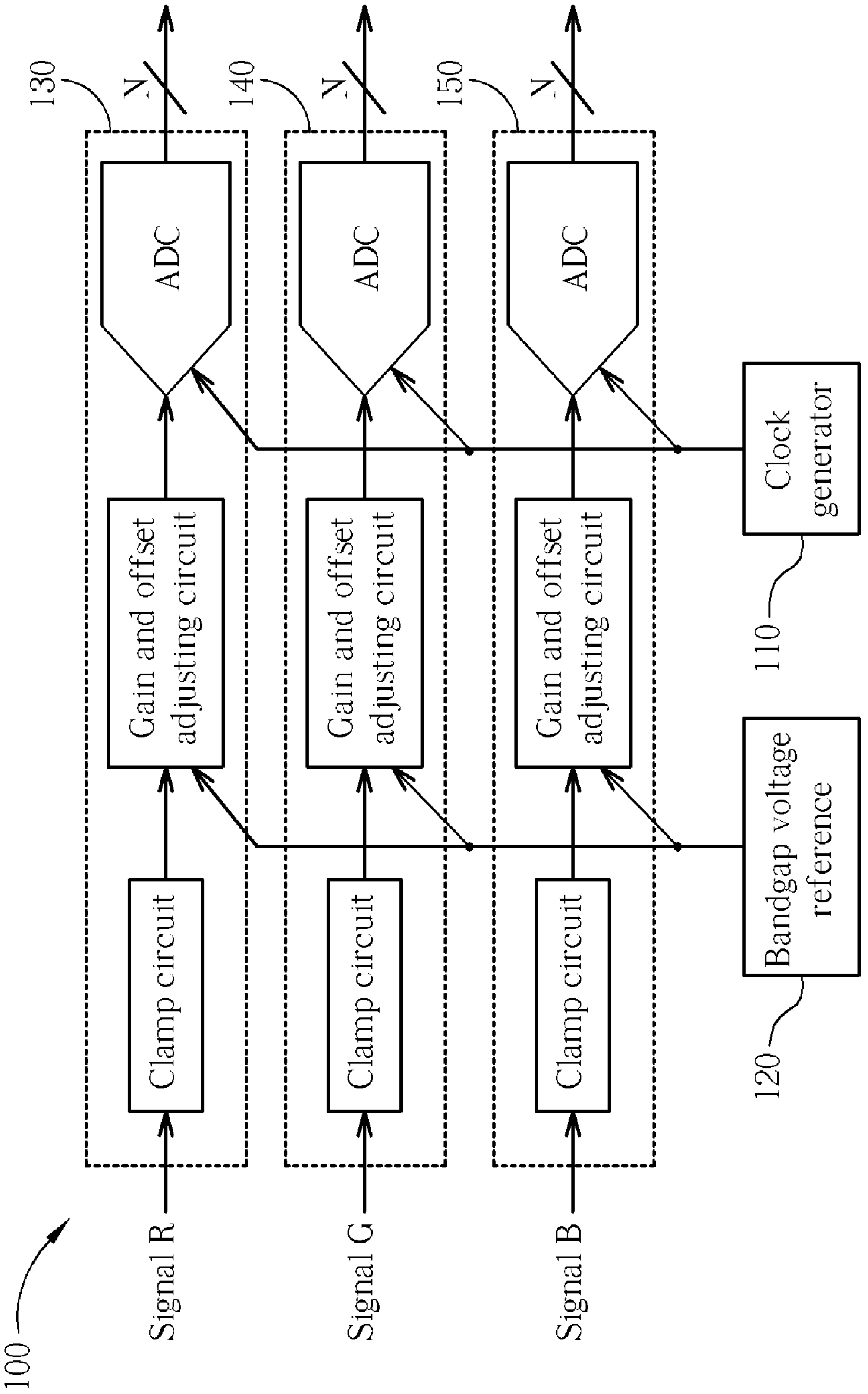
Fig. 1 Prior art
FIG. 1 is a block diagram of an analog front-end (AFE) circuit of a digital display according to the prior art.
Figure 2:
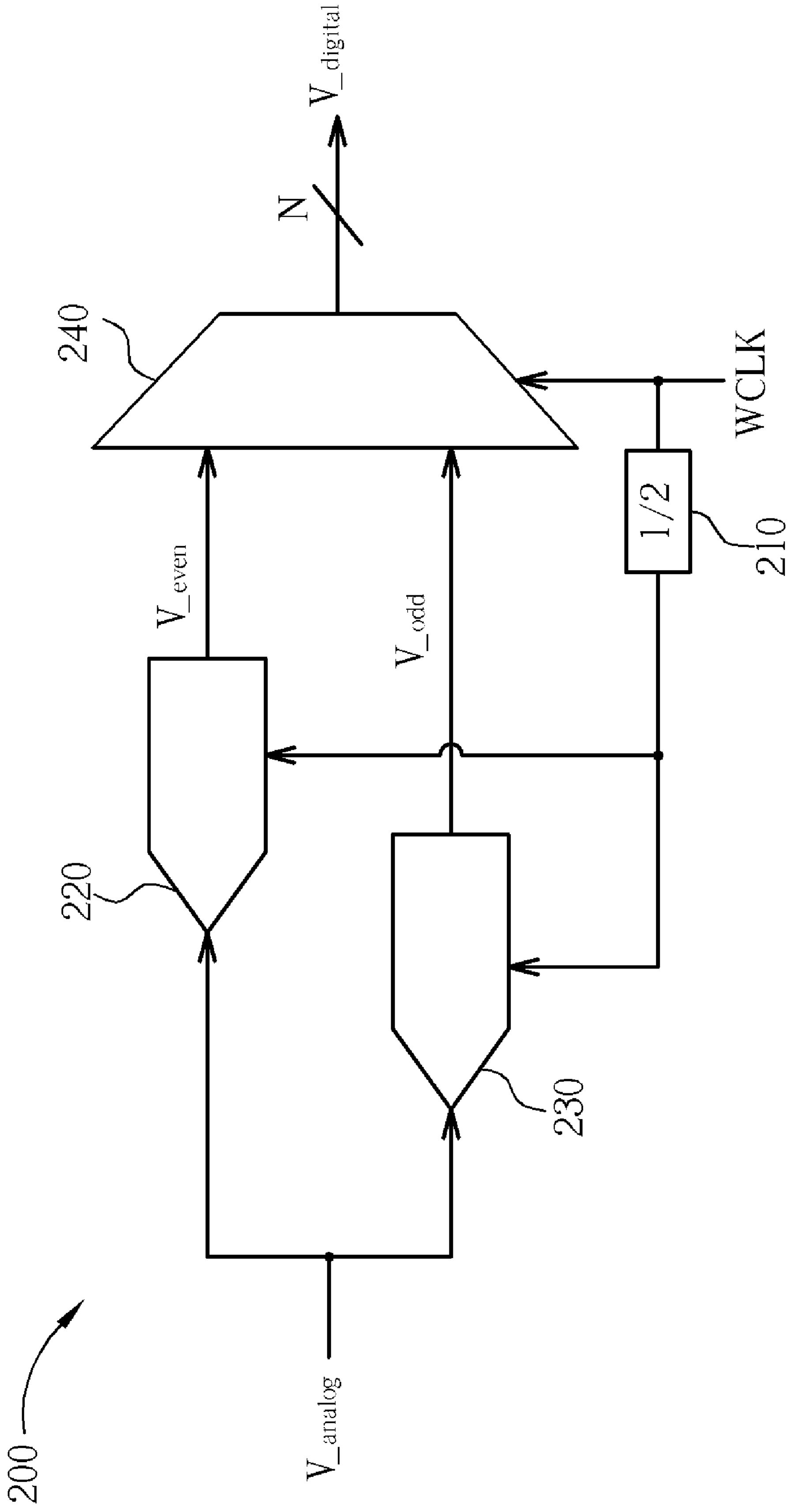
Fig. 2 Prior art
FIG. 2 is a simplified block diagram of an AFE circuit with interleaved analog-to-digital converters according to the prior art.
Figure 3:
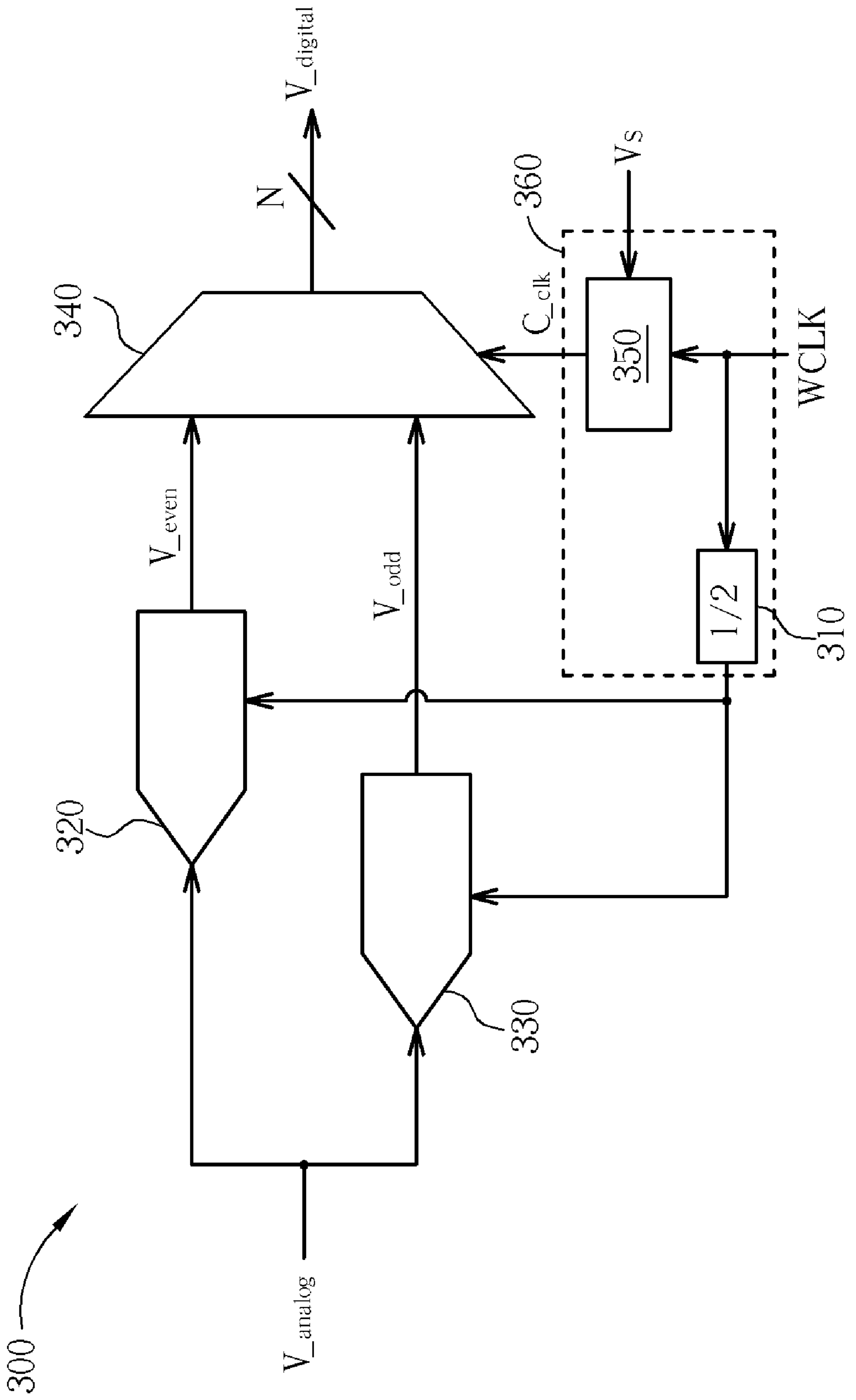
FIG. 3 is a simplified block diagram of an AFE circuit according to one embodiment of the present invention.

Please refer to FIG. 3, which shows a simplified block diagram of an AFE circuit 300 according to one embodiment of the present invention. The AFE circuit 300 adopts the interleaved ADC architecture. As shown, the AFE circuit 300 comprises a first analog-to-digital converter (ADC) 320, a second ADC 330, and a clock control circuit 360; the first and second ADC construct a time-interleaved ADC. In FIG. 3, the analog video signal V_analog corresponds to one of the three primary colors R, G, or B.

The clock control circuit 360 is arranged for intermittently or alternatively inverting a working clock to generate a control signal. The clock control circuit 360 is also employed to generate a sampling signal according to the control signal or the working clock. In one embodiment, the clock control circuit 360 comprises a first frequency divider 310 and a control unit 350. In this embodiment, the first frequency divider 310 is arranged for dividing the frequency of a working clock WCLK by two to generate the sampling signal. In other words, the frequency of the sampling signal is half of the working clock WCLK. The first ADC 320 converts the even pixels of the analog video signal V_analog into a first digital video signal V_even according to the sampling signal. The second ADC 330 converts the odd pixels of the analog video signal V_analog into a second digital video signal V_odd according to the sampling signal.

In practice, the first frequency divider 310 of the clock control circuit 360 can be designed to generate the sampling signal by dividing the frequency of the control signal or an inverted signal of the working clock WCLK.

In this embodiment, the control unit 350 of the clock control circuit 360 is arranged for intermittently inverting the working clock WCLK to generate a control signal C_clk. The control signal C_clk is employed to control the first multiplexer 340 to selectively output the first digital video signal V_even or the second digital video signal V_odd.

Figure 4:
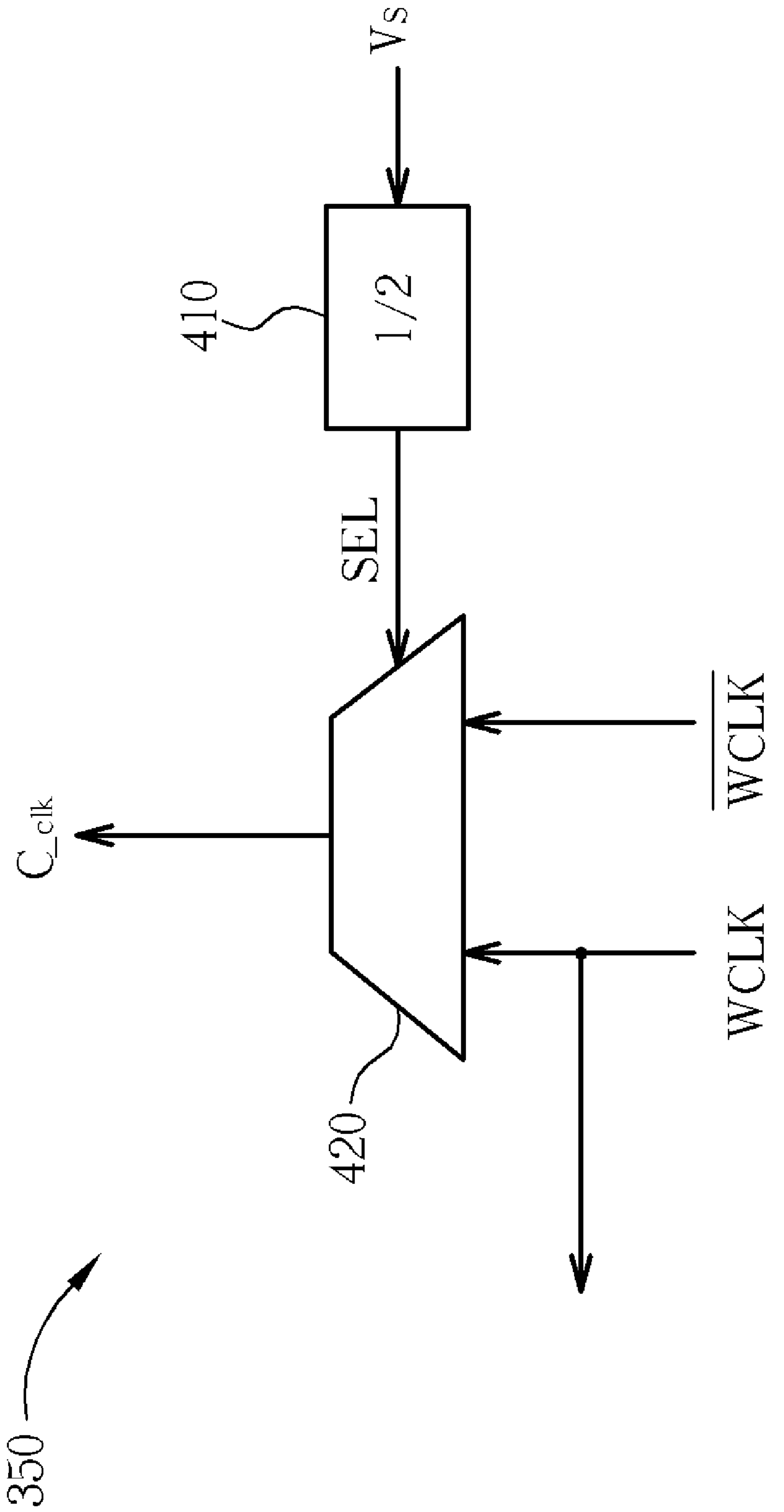
FIG. 4 is a block diagram of a control unit of FIG. 3 according to a first embodiment of the present invention.

In practice, the control unit 350 can be implemented utilizing other design choices. For example, FIG. 4 shows a block diagram of the control unit 350 according to a first embodiment of the present invention. In this embodiment, a second frequency divider 410 is employed in the control unit 350 to divide the frequency of a vertical sync signal Vs by two to produce a selection signal SEL. A second multiplexer 420 is then utilized to selectively output the working clock WCLK or an inverted clock $\overline{WCLK}$ of the working clock WCLK to be the control signal C_clk under the control of the selection signal SEL.

As is well known in the art, each pulse of the vertical sync signal Vs corresponds to an individual frame. In another aspect, the interval between two successive pulses corresponds to the data length of an entire frame. Accordingly, the logical level of the selection signal SEL generated from the second frequency divider 410 will be alternated between two successive frames. For example, in one embodiment, the selection signal SEL is at logic 1 during the period of each odd frame and then goes to logic 0 during the period of each even frame. If the second multiplexer 420 outputs the working clock WCLK as the control signal C_clk when the selection signal SEL is at logic 1 (i.e., during the period of each odd frame), then it will output the inverted clock $\overline{WCLK}$ as the control signal C_clk when the selection signal SEL goes to logic 0 (i.e., during the period of each even frame).

Therefore, the timing of outputting the first digital video signal V_even and the second digital video signal V_odd from the first multiplexer 340 during the period of the odd frame is opposite to that during the period of the even frame. As a result, the light stripes and shade stripes on the odd picture caused by the mismatch between the ADC 320 and ADC 330 will be swapped or alternated on the even frame. Specifically, the light stripes on the odd frame will become shade stripes on the even frame and the shade stripes on the odd frame will become light stripes on the even frame. The human eye averages the visual effects of successive frames. Therefore, the human eye will not be able to detect the above-described image defects caused by the mismatch between ADC 320 and ADC 330.

Figure 5:
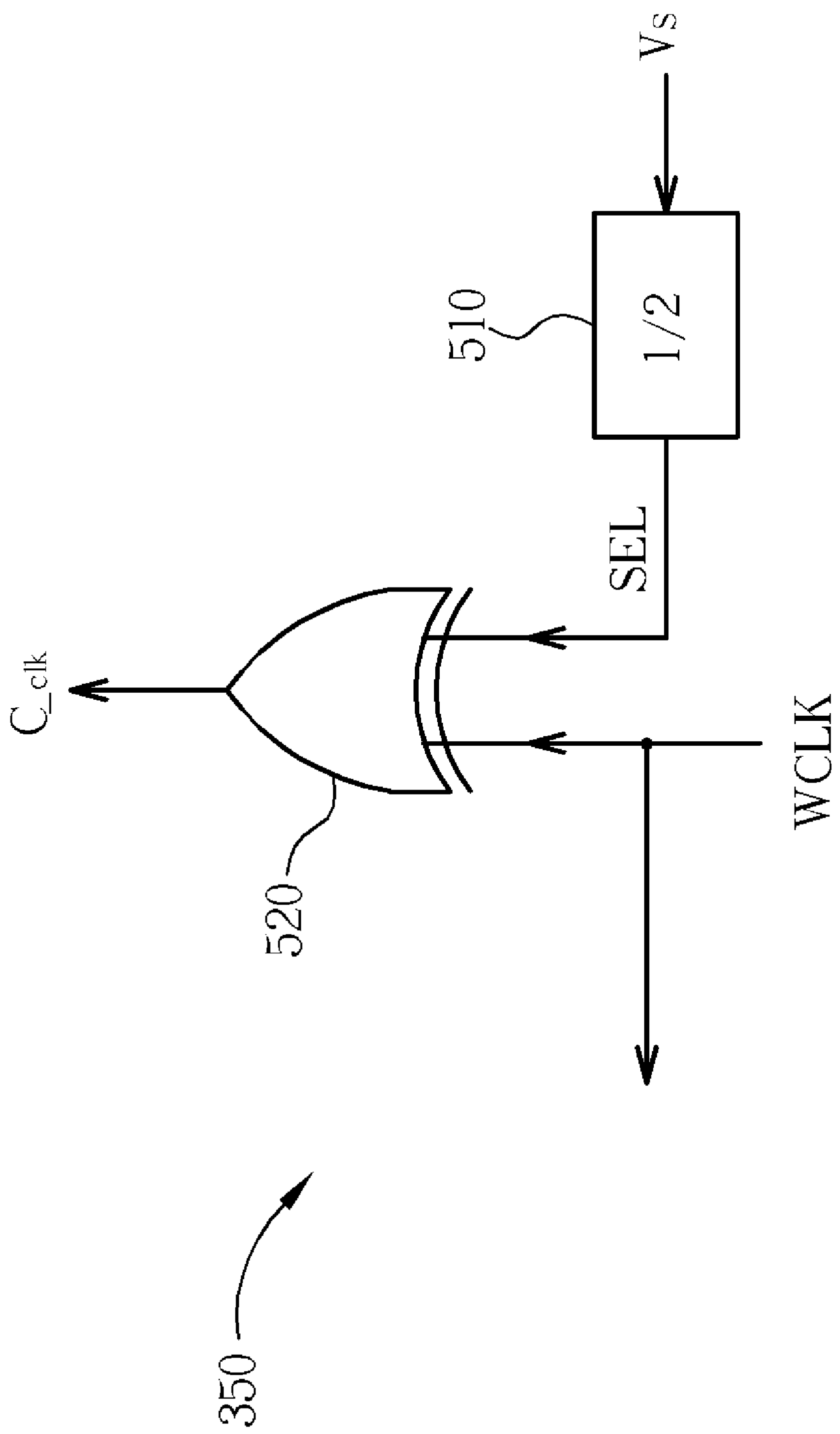
FIG. 5 is a block diagram of the control unit of FIG. 3 according to a second embodiment of the present invention.

FIG. 5 shows a block diagram of the control unit 350 according to a second embodiment of the present invention. In this embodiment, a third frequency divider 510 is employed in the control unit 350 to divide the frequency of the vertical sync signal Vs by two to generate a selection signal SEL. Then, an XOR gate 520 is utilized for receiving the selection signal SEL and the working clock WCLK to produce the control signal C_clk. By utilizing the XOR gate 520, the polarity of the control signal C_clk will alternate between two successive frames, i.e. the polarity of the control signal C_clk during the period of the odd frame will be opposite to the polarity of the control single C_clk during the period of the even frame. This renders the timing of outputting the first digital video signal V_even and the second digital video signal V_odd from the first multiplexer 340 during the period of the odd frame as opposite of that during the period of the even frame.

In practice, the divisor of the frequency dividers 410 and 510 can be set to another value other than 2. For example, the divisor of the frequency dividers 410 and 510 can be set to 4. When a divisor is set to a value of 4 the timing of outputting the first digital video signal V_even and the second digital video signal V_odd from the first multiplexer 340 changes every other frame.

In addition, the clock control circuit 360 can be designed to invert the working clock WCLK every other predetermined time period. Thereto, in another embodiment, the frequency divider 410 or 510 of the clock control circuit 360 is replaced with a counter (not shown). The counter is utilized for generating a count value by counting pulses of the working clock WCLK or by counting pulses of the vertical sync signal Vs. In this embodiment, each time the count value reaches a predetermined value; the clock control circuit 360 utilizes the second multiplexer 420 or the XOR gate 520, mentioned above, to invert the working clock WCLK.

Note that, other means exist that allows the first multiplexer 340 to periodically swap the output timing of the digital video signals V_even and V_odd. These other means should also be included in the embodiment of the present invention.

Additionally, in the AFE circuit 300, the number of ADCs employed to process each color signal can be extended beyond two. In this situation, the divisor of the first frequency divider 310 should be correspondingly adjusted according to the number of ADCs employed. For example, when three ADCs are employed to process a single color signal, the divisor of the first frequency divider 310 should be configured to three. In practical implementations, since the control signal C_clk generated from the control unit 350 has the same frequency as the working clock WCLK, the first frequency divider 310 can also divide the frequency of the control signal C_clk to generate the sampling signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog front-end (AFE) circuit of a digital display, comprising:

a first circuit to intermittently invert a working clock to generate a control signal and to generate a sampling signal, wherein the sampling signal is corresponding to the working clock;

a first analog-to-digital converter (ADC) coupled to the first circuit for converting an analog video signal into a first digital video signal according to the sampling signal;

a second analog-to-digital converter coupled to the first circuit for converting the analog video signal into a second digital video signal according to the sampling signal; and a first multiplexer for selectively outputting the first digital video signal or the second digital video signal according to the control signal;

wherein the first circuit comprises:

a frequency divider for dividing a vertical sync signal to generate a selection signal; and a control signal outputting unit for outputting the working clock or an inverted signal of the working clock to be the control signal according to the selection signal.

2. The analog front-end circuit of claim 1, wherein the first circuit inverts the working clock after a frame of the analog video signal is transmitted.

3. The analog front-end circuit of claim 1, wherein the first circuit generates the working clock according to a vertical sync signal.

4. The analog front-end circuit of claim 1, wherein the first circuit intermittently inverts the working clock according to a predetermined time period.

5. The analog front-end circuit of claim 1, wherein the analog video signal corresponds to one of the three primary colors R, G, or B.

6. The analog front-end circuit of claim 1, wherein the first digital video signal corresponds to even pixels while the second digital video signal corresponds to odd pixels.

7. The analog front-end circuit of claim 1, wherein the first circuit comprises:

a second frequency divider for generating the sampling signal, wherein the frequency of the working clock is substantially twice as much as that of the sampling signal.

8. The analog front-end circuit of claim 1, wherein the control signal outputting unit is a second multiplexer.

9. The analog front-end circuit of claim 1, wherein the control signal outputting unit is an XOR gate.

10. A method for controlling an analog front-end circuit of a digital display, comprising:

intermittently inverting a working clock to generate a control signal;

generating a sampling signal, wherein the sampling signal is corresponding to the working clock;

converting an analog video signal into a first digital video signal according to the sampling signal;

converting the analog video signal into a second digital video signal according to the sampling signal; and selectively outputting the first digital video signal or the second digital video signal according to the control signal;

wherein the step of generating the control signal further comprises:

dividing a vertical sync signal to generate a selection signal;

outputting the working clock or an inverted signal of the working clock to be the control signal according to the selection signal.

11. The method of claim 10, wherein the step of generating the control signal further comprises:

inverting the working clock after a frame of the analog video signal is transmitted.

12. The method of claim 10, wherein the step of generating the control signal further comprises:

determining whether the working clock is inverted according to a vertical sync signal.

13. The method of claim 10, wherein the working clock is intermittently inverted according to a predetermined time period.

14. The method of claim 10, wherein the working clock is inverted when the pulses of the working clock reach a predetermined number.

15. The method of claim 10, wherein the analog video signal corresponds to one of the three primary colors R, G, or B.

16. The method of claim 10, wherein the first digital video signal corresponds to even pixels while the second digital video signal corresponds to odd pixels.

17. The method of claim 10, wherein the frequency of the working clock is substantially twice as much as that of the sampling signal.

18. An analog front-end (AFE) circuit of a digital display, comprising:

a clock control circuit for generating a sampling signal and for alternately outputting a working clock and an inverted signal of the working clock as a control signal;

a data converter for converting an analog video signal into a first digital video signal and a second digital video signal according to the sampling signal; and a multiplexer for selectively outputting the first digital video signal or the second digital video signal according to the control signal;

wherein the clock control circuit further comprise:

a frequency divider for dividing a vertical sync signal to generate a selection signal; and a control signal outputting unit for outputting the working clock or an inverted signal of the working clock to be the control signal according to the selection signal.

19. The analog front-end circuit of claim 18, wherein the frequency of the working clock is substantially twice as much as that of the sampling signal.

20. The analog front-end circuit of claim 18, wherein the data converter is a time-interleaved analog-to-digital converter.

* * * * *